United States Patent [19]

Asija

[11] Patent Number: 5,576,673

[45] Date of Patent: Nov. 19, 1996

[54] SMALL, LOW-PASS FILTER FOR HIGH POWER APPLICATIONS

[75] Inventor: Ajay Asija, Brighton, N.Y.

[73] Assignee: Harris Corporation, Melbourne, Fla.

[21] Appl. No.: 302,413

[22] Filed: Sep. 8, 1994

[51] Int. Cl.⁶ .......................... H01P 1/205; H01P 1/202
[52] U.S. Cl. ........................ 333/206; 333/168; 333/175
[58] Field of Search .................................. 333/168, 175, 333/206, 245

[56] References Cited

U.S. PATENT DOCUMENTS

| | | | |
|---|---|---|---|
| 2,844,801 | 7/1958 | Sabarott | 333/181 |
| 3,267,396 | 8/1966 | Scott | 333/167 |
| 3,506,936 | 4/1970 | Loos et al. | |
| 3,541,478 | 11/1970 | Peterson et al. | 333/185 |
| 3,579,156 | 5/1971 | Parfitt | 333/167 |
| 3,909,755 | 9/1975 | Kaunzinger | 333/73 C |
| 4,021,759 | 5/1977 | Campi | |
| 4,223,287 | 9/1980 | Nishikawa et al. | 333/206 |
| 4,680,560 | 7/1987 | Yorita et al. | 333/206 |

FOREIGN PATENT DOCUMENTS 1170582  3/1966  United Kingdom.

*Primary Examiner*—Benny Lee
*Assistant Examiner*—David H. Vu
*Attorney, Agent, or Firm*—Rogers & Killeen

[57] ABSTRACT

A small (about 8 inches long) low pass, high power (4000 watts) electric filter may include a tubular outer conductor separated from an dielectric sleeve by an outer dielectric that may be an air-filled gap. The dielectric sleeve surrounds a series of alternating capacitive elements and inductive elements. Each of the capacitive elements includes an inner conductor, such as a copper slug, that contacts the dielectric sleeve. Each of the inductive elements has a helical wire coil surrounded by a dielectric silicone compound that contacts the dielectric sleeve and the inner conductor. The silicone compound in the inductive elements facilitates heat transfer from the inductive elements and increases capacitive capacity. The air gap between the outer conductor and the dielectric sleeve adds another capacitor. The outer conductor and the dielectric sleeve may touch to improve heat transfer from the filter.

34 Claims, 2 Drawing Sheets

SMALL, LOW-PASS FILTER FOR HIGH POWER APPLICATIONS

BACKGROUND OF THE INVENTION

The present invention is directed to electrical filters, and more particularly to low pass filters for high power applications.

Electrical filters find use in radio frequency transmission paths to block unwanted frequencies. With reference to FIGS. 1 and 2, an electrical filter 10 of the prior art may include a series of alternating capacitive elements 12 and inductive elements 14 in an electrically conductive tube 16. The capacitive elements 12 are separated from the tube 16 by a dielectric 18, and the inductive elements 14 are surrounded by air. The elements 12 and 14 are electrically connected to form a first electrical path 20 therethrough. The tube 16 forms a second electrical path 22, with the capacitive elements 12 forming parallel shunts to the second path 20. See, for example, U.S. Pat. No. 4,680,560 issued Jul. 14, 1967 to Yorita, et al.

It is desirable to reduce the size of electrical filters while maintaining their operational capability. However, such filters tend to generate heat, and size reductions exacerbate the problem of conducting away heat generated by the capacitive and inductive elements inside the filter. Filters of reduced size are not adaptable to high power applications (up to about 4000 Watts), and filters capable of handling high power are larger than desired.

Accordingly, it is an object of the present invention to provide a novel electric filter that obviates the problems of the prior art.

It is another object of the present invention to provide a novel electric filter that is small, yet is able to conduct heat from the heat generating components inside the filter so that the filter can operate at high power.

It is yet another object of the present invention to provide a novel electric filter that includes a thermally conductive dielectric around the inductive elements that is in contact with a thermally conductive dielectric sleeve around all the elements and with adjacent capacitive elements to improve heat conduction from the inductive elements.

It is still another object of the present invention to provide a novel electric filter in which air separates the filter's outer electrically conductive tube from an internal dielectric sleeve that surrounds the filter elements, thereby forming two series-connected capacitors within each capacitive element to improve performance in a small filter.

It is a further object of the present invention to provide a novel electric filter that includes a thermally conductive dielectric sleeve around the filter elements that is separated from the outer conductor by an air-filled gap, the sleeve and the outer conductor touching to improve heat conduction from the interior of the filter.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
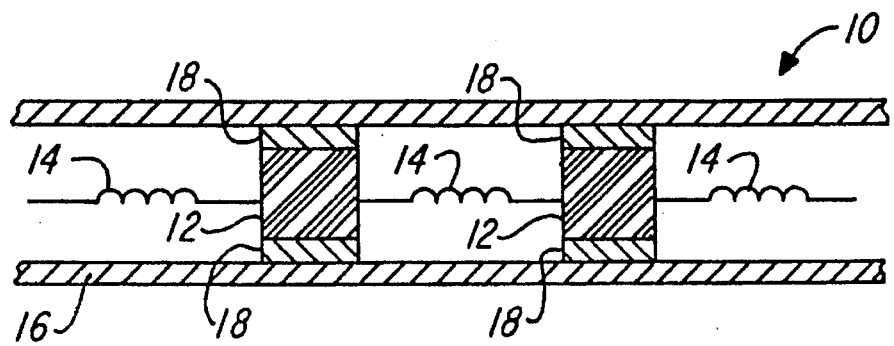
FIG. 1 is a vertical cross section of a prior art electric filter illustrating the alternating series of capacitive and inductive elements.
Figure 2:
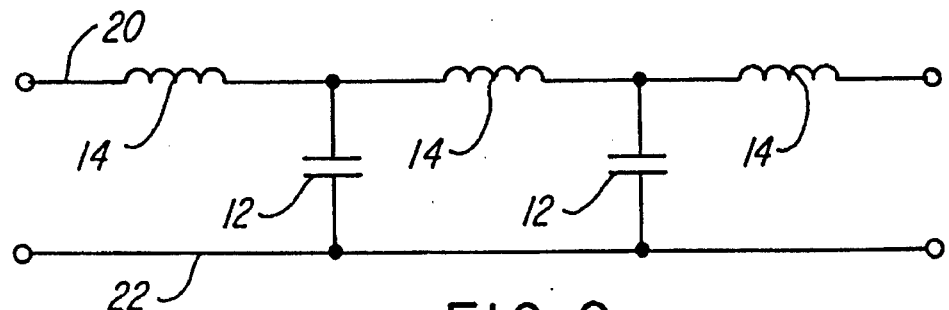
FIG. 2 is a circuit diagram of the filter of FIG. 1.
Figure 3:
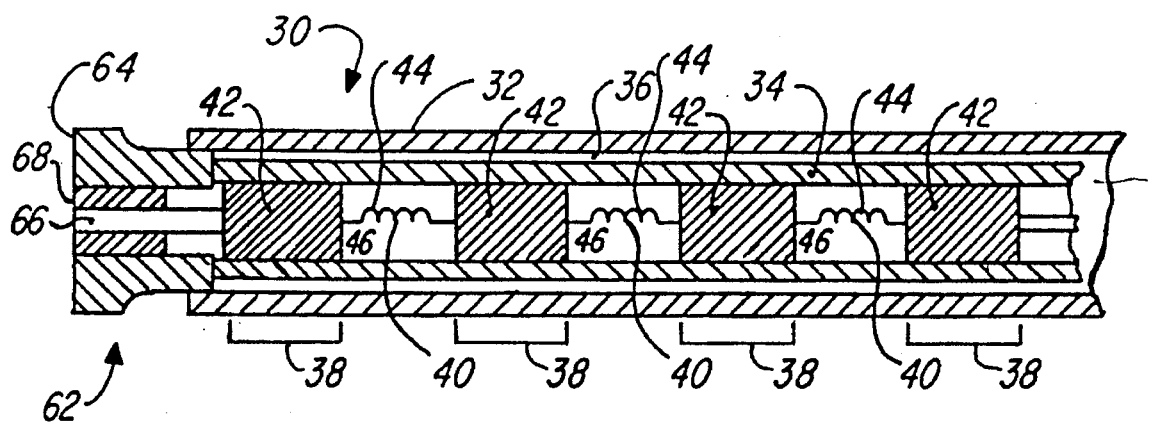
FIG. 3 is a vertical cross section of an embodiment of the filter of the present invention.

With reference now to FIG. 3, an embodiment of the electric filter 30 of the present invention may include an outer electrical conductor 32 separated from an intermediate dielectric 34 by an outer dielectric 36. The intermediate dielectric 34 surrounds a series of alternating capacitive elements 38 and inductive elements 40. Each of the capacitive elements 38 may include an inner electrical conductor 42 that contacts the intermediate dielectric 34. Each of the inductive elements 40 may include a helical wire coil 44 surrounded by an inner dielectric 46 that contacts the intermediate dielectric 34 and the inner electrical conductor 42.

Figure 4:
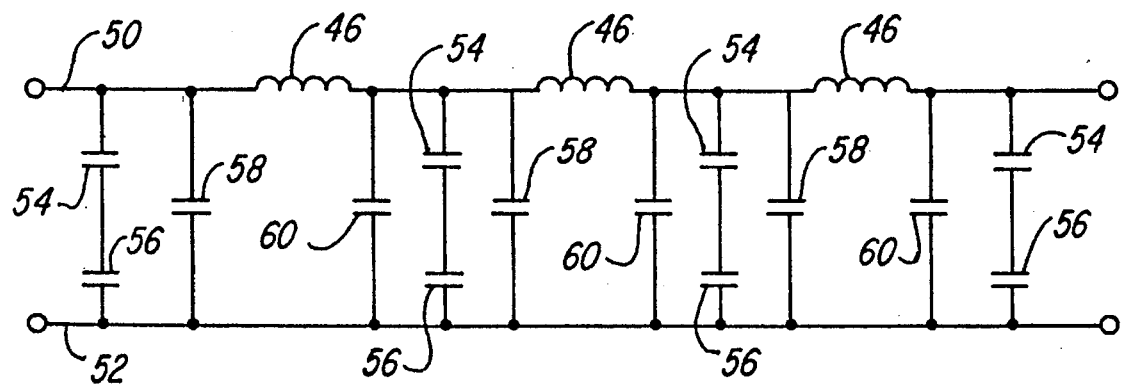
FIG. 4 is a circuit diagram of the filter of FIG. 3.

A circuit diagram for the embodiment of FIG. 3 may be seen in FIG. 4. A first transmission path 50 is provided by the inner electrical conductors 42 and the coils 44, and a second transmission path 52 is provided by the outer conductor 32. Each of the capacitive elements 38 includes two capacitors in series that form a shunt between the first and second transmission paths: a first capacitor 54 formed by the inner electrical conductor 42 and the intermediate dielectric 34, and a second capacitor 56 formed by the intermediate dielectric 34 and the outer dielectric 36. Each of the inductive elements also includes capacitors 58 and 60 that shunt between the two transmission paths. The capacitors 58 and 60 are formed by the inner dielectric 46 surrounding the coil 44 and the outer conductor 32.

In a preferred embodiment: the outer conductor 32 and inner conductor 42 are highly electrically and thermally conductive and may be copper; the inner dielectric 46 is thermally conductive, has a low loss factor and may be a silicone compound; the intermediate dielectric 34 is thermally conductive and has a high dielectric constant and may be an aluminum compound; and the outer dielectric 36 may be a gaseous dielectric. While the size of the filter will depend on the particular application, it is desirable that the filter be small, that is, have a length of between about 5 and 10 inches and a diameter of between about one-half and one and one-half inches.

In another preferred embodiment, there are four capacitive elements 38 and three inductive elements 40. The outer conductor 32 is a ⅞" copper pipe about 8" long with a volume of about 5 cubic inches, and the inner conductor 42 is a solid copper slug between about one and two inches long and about ⅝ inch in diameter. The inner dielectric 46 is a silicone based, heat conducting, low loss epoxy, such as Emerson & Cummings Ecosil 5954, the intermediate dielectric 34 is a tubular sleeve of aluminum oxide that may have a thickness of about 0.06 inches with a dielectric constant $\epsilon_r = 9.3$, and the outer dielectric 36 is a gap about 0.02 inches wide filled with air. This embodiment can handle 4000 Watts (about 800 watts per cubic inch) into a 4:1 load with a maximum insertion loss of about 0.05 dB in the 2–30 MHz region, and with a 155 MHz cutoff frequency.

With reference again to FIG. 3, each end of the filter 30 may include an end piece 62 for contacting the transmission paths 50 and 52. In the end piece 62, a first terminal 64 contacts the outer conductor 32, and a second terminal 66 contacts a capacitive element 38 at the end of the filter. Appropriate insulation 68 between the two terminals may be provided. The end piece 62 may contact a heat sink (not shown) to conduct heat away from the filter 30.

In operation, the intermediate dielectric 34 provides both a high dielectric constant, making a high capacity capacitor available in a small space, and good thermal conductivity to conduct heat from the elements 38 and 40. The silicone compound surrounding the inductive elements 40 transfers heat from inductive elements 40 to the adjoining capacitive elements 38 (that is, to the copper slugs) and to the intermediate dielectric 34. The silicone compound is low loss so that filter performance is not degraded. The additional capacitors 56–60 provided by the outer dielectric 36 and the inner dielectric 46 increase the capacitive capacity of the filter to help achieve high power performance.

Figure 5:
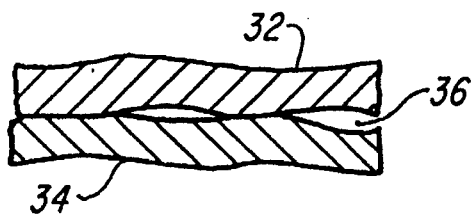
FIG. 5 is a vertical cross section of a part of the outer conductor and intermediate dielectric illustrating contact therebetween that facilitates heat conduction during filter operation.

When the filter is operating the outer conductor 32 and intermediate dielectric 34 may expand and contract so that they touch in one or more locations along the length of the filter, such as illustrated in FIG. 5. This occurrence does not degrade filter performance (the reduction in capacitive capacity due to the loss of a small portion of outer dielectric 36 is minimal) and is used to advantage herein because it provides an additional path for conducting heat away from the interior of the filter. The additional heat transfer capacity provided by the contact may provide an automatic increase in heat transfer capability as temperature increases.

Figure 6:
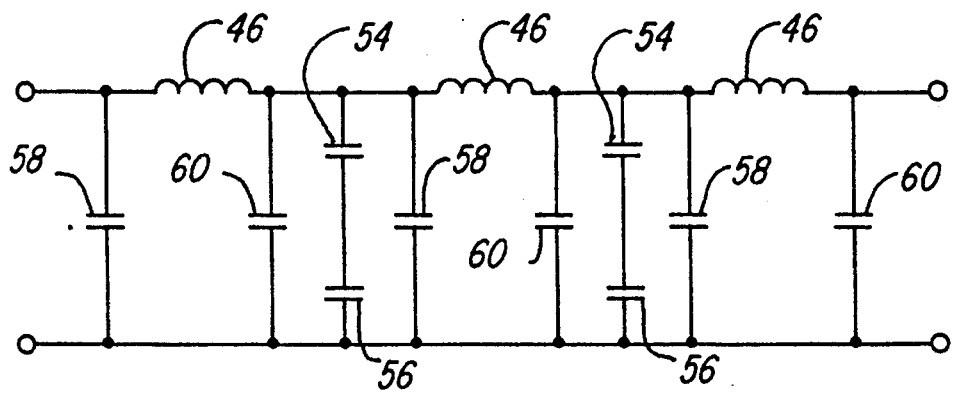
FIG. 6 is a circuit diagram of an alternative embodiment of the present invention.

In an alternative embodiment, the series of capacitive and inductive elements may begin and end with an inductive element, instead of a capacitive element. A circuit diagram for this alternative is shown in FIG. 6. The construct of the filter will be the same as FIG. 3, with inductive elements 40 at the ends.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. An electrical filter comprising:

an alternating series of at least one capacitive element and at least one inductive element, said series being within an intermediate dielectric surrounded by an outer electrical conductor, said capacitive element comprising an inner electrical conductor that contacts said intermediate dielectric, and said inductive element comprising an inner dielectric other than air that contacts said intermediate dielectric and said inner electrical conductor.

2. The filter of claim 1 further comprising an outer dielectric between said intermediate dielectric and said outer electrical conductor, said capacitive element thereby comprising two capacitors in series, a first capacitor formed of said inner electrical conductor and said intermediate dielectric, and a second capacitor formed of said intermediate dielectric and said outer dielectric.

3. The filter of claim 1 wherein said outer electrical conductor and said intermediate dielectric are in contact when the filter is operating to improve heat conduction from said series.

4. The filter of claim 1 wherein said intermediate dielectric and said outer electrical conductor are hollow cylinders.

5. The filter of claim 4 comprising four said capacitive elements and three said inductive elements.

6. The filter of claim 4 wherein said outer electrical conductor has a length of between about 5 and 10 inches and a diameter of between about one-half and one and one-half inches.

7. An electrical filter comprising:

a series of capacitive elements and inductive elements within an intermediate dielectric that is surrounded by an outer dielectric that is surrounded by an outer electrical conductor, each of said capacitive elements comprising an inner electrical conductor that contacts said intermediate dielectric, each of said capacitive elements comprising two capacitances in series, a first capacitor formed of said inner electrical conductor and said intermediate dielectric, and a second capacitor formed of said intermediate dielectric and said outer dielectric.

8. The filter of claim 7 wherein said series of capacitive and inductive elements comprises alternating ones of said capacitive and inductive elements and wherein said series begins and ends with one of said capacitive elements.

9. An electrical filter comprising:

an alternating series of at least one capacitive element and at least one inductive element, wherein said capacitive element comprises an inner electrical conductor, an intermediate dielectric surrounding said inner electrical conductor, and an outer electrical conductor surrounding said intermediate dielectric;

an inner dielectric other than air is between said inductive element and said intermediate dielectric; and an outer dielectric between said intermediate dielectric and said outer electrical conductor.

10. The filter of claim 9 further comprising an end piece with inner and outer terminals, said end piece connecting said inner electrical conductor to said inner terminal and connecting said outer electrical conductor to said outer terminal.

11. The filter of claim 9 wherein said outer dielectric comprises an air layer.

12. The filter of claim 9 wherein said intermediate dielectric is thermally conductive.

13. The filter of claim 12 wherein said intermediate dielectric comprises aluminum oxide.

14. The filter of claim 9 wherein said inner electrical conductor and said outer electrical conductor comprise thermally conductive metal.

15. The filter of claim 9 wherein said inner dielectric is thermally conductive.

16. The filter of claim 15 wherein said inner dielectric comprises a silicone compound.

17. The filter of claim 9 wherein a signal power capacity of said filer is about 4000 Watts.

18. The filter of claim 9 wherein said intermediate dielectric contacts said outer electrical conductor during operation of said filter so that heat can be conducted from said intermediate dielectric to said outer electrical conductor.

19. The filter of claim 9 wherein said alternating series of capacitive and inductive elements begins and ends with ones of said capacitive elements.

20. The filter of claim 9 wherein said alternating series of capacitive and inductive elements begins and ends with ones of said inductive elements.

21. A high power, low-pass electrical filter comprising:

an alternating series of at least two capacitive elements and at least one inductive element, said series beginning and ending with ones of said capacitive elements, wherein said capacitive elements each comprise a cylindrical inner copper conductor, an aluminum oxide tube surrounding said inner copper conductor, and a copper tube surrounding said aluminum oxide tube with an air layer therebetween; and a silicone compound dielectric between said inductive element and said aluminum oxide tube.

22. In an electrical filter having an alternating series of capacitive and inductive elements contained within a thermally conductive housing, the improvement comprising a silicone compound dielectric between said inductive elements and said thermally conductive housing for conducting thermal energy from said inductive elements.

23. The improved filter of claim 22 wherein said inductive elements comprise a shunt capacitor formed with said silicone compound.

24. In an electrical filter having an alternating series of capacitive and inductive elements contained within an electrically conductive housing, the improvement comprising an aluminum oxide dielectric tube surrounding said capacitive and inductive elements that is separated from said electrically conductive housing by a gaseous dielectric.

25. An electrical circuit comprising an alternating series of capacitive and inductive elements in an electrically conductive tube wherein each of said capacitive elements comprises two series-connected capacitors that connect said series of elements to said tube, and wherein each of said inductive elements comprises a shunt capacitor that is electrically parallel to said two capacitors.

26. The circuit of claim 25 further comprising an intermediate dielectric between said series of elements and said tube, and an outer dielectric between said intermediate dielectric and said tube.

27. The circuit of claim 26 wherein said outer dielectric is air.

28. An electrical filter comprising:

an alternating series of at least one capacitive element and at least one inductive element, wherein said capacitive element comprises an inner electrical conductor, an intermediate dielectric surrounding said inner electrical conductor, and an outer electrical conductor surrounding said intermediate dielectric; and an inner dielectric other than air between said inductive element and said intermediate dielectric, said intermediate dielectric contacting said outer electrical conductor during operation of said filter so that heat can be conducted from said intermediate dielectric to said outer electrical conductor.

29. An electrical filter comprising:

an alternating series of at least one capacitive element and at least one inductive element, wherein said capacitive element comprises an inner electrical conductor, an intermediate dielectric surrounding said inner electrical conductor, and an outer electrical conductor surrounding said intermediate dielectric; and an inner dielectric between said inductive element and said intermediate dielectric, said intermediate dielectric contacting said outer electrical conductor during operation of said filter so that heat can be conducted from said intermediate dielectric to said outer electrical conductor, wherein, an air layer is between said intermediate dielectric and said outer electrical conductor.

30. An electrical filter comprising:

an alternating series of at least one capacitive element and at least one inductive element;

an outer electrical conductor surrounding an intermediate dielectric which contains said series;

said capacitive element comprising an inner electrical conductor that contacts said intermediate dielectric;

said inductive element comprising an inner dielectric other than air that contacts said intermediate dielectric and said inner electrical conductor; and an outer dielectric between said intermediate dielectric and said outer electrical conductor, thereby said capacitive element comprises two capacitors in series, a first capacitor formed of said inner electrical conductor and said intermediate dielectric, and a second capacitor formed of said intermediate dielectric and said outer dielectric.

31. The filter of claim 30 wherein said inner dielectric comprises a silicone compound.

32. The filter of claim 30 wherein said intermediate dielectric comprises aluminum oxide.

33. The filter of claim 30 wherein said outer dielectric comprises air.

34. The filter of claim 30 wherein said inner and outer electrical conductors comprise copper.

\* \* \* \* \*